United States Patent
Trautmann et al.

(10) Patent No.: US 10,636,901 B2
(45) Date of Patent: Apr. 28, 2020

(54) METHOD FOR PRODUCING A SUBSTRATE, SUBSTRATE, METAL-OXIDE-SEMICONDUCTOR FIELD-EFFECT TRANSISTOR WITH A SUBSTRATE, MICRO-ELECTROMECHANICAL SYSTEM WITH A SUBSTRATE, AND MOTOR VEHICLE

(71) Applicant: Robert Bosch GmbH, Stuttgart (DE)

(72) Inventors: Achim Trautmann, Leonberg (DE); Christian Tobias Banzhaf, Laichingen (DE)

(73) Assignee: Robert Bosch GmbH, Stuttgart (DE)

( * ) Notice: Subject to any disclaimer, the term of this patent is extended or adjusted under 35 U.S.C. 154(b) by 553 days.

(21) Appl. No.: 14/917,009

(22) PCT Filed: Aug. 7, 2014

(86) PCT No.: PCT/EP2014/066951
§ 371 (c)(1),
(2) Date: Mar. 5, 2016

(87) PCT Pub. No.: WO2015/032577
PCT Pub. Date: Mar. 12, 2015

(65) Prior Publication Data
US 2016/0218208 A1  Jul. 28, 2016

(30) Foreign Application Priority Data
Sep. 5, 2013  (DE) .......... 10 2013 217 768

(51) Int. Cl.
*H01L 29/78* (2006.01)
*H01L 21/308* (2006.01)
(Continued)

(52) U.S. Cl.
CPC ...... *H01L 29/7813* (2013.01); *H01L 21/3083* (2013.01); *H01L 29/045* (2013.01);
(Continued)

(58) Field of Classification Search
CPC ............ H01L 29/7813; H01L 29/1095; H01L 29/4236; H01L 21/3083; H01L 29/1608
See application file for complete search history.

(56) References Cited

U.S. PATENT DOCUMENTS 5,741,741 A * 4/1998 Tseng ................ H01L 21/76813
257/E21.257
5,744,826 A * 4/1998 Takeuchi ............ H01L 29/7828
257/328
(Continued)

FOREIGN PATENT DOCUMENTS

EP   2 258 655 A1   12/2010
JP   2005-142243 A   6/2005
(Continued)

OTHER PUBLICATIONS

International Search Report corresponding to PCT Application No. PCT/EP2014/066951, dated Oct. 6, 2014 (German and English language document) (7 pages).
(Continued)

*Primary Examiner* — David Vu
(74) *Attorney, Agent, or Firm* — Maginot, Moore & Beck LLP

(57) ABSTRACT

A method for producing a substrate for a metal-oxide-semiconductor field-effect transistor or a micro-electromechanical system includes dry etching a preliminary trench into the substrate by using a structured first masking layer. The substrate includes a silicon carbide layer, and the dry etching is carried out in such a way that a remnant of the first structured masking layer remains. The method further includes applying a second masking layer at least to walls of the preliminary trench and dry etching by using the remnant of the first masking layer and the second masking layer so as to produce a trench with a step in the trench.

5 Claims, 3 Drawing Sheets

(51) Int. Cl.
  *H01L 29/16* (2006.01)
  *H01L 29/66* (2006.01)
  *H01L 29/423* (2006.01)
  *H01L 29/04* (2006.01)
  *H01L 29/10* (2006.01)

(52) U.S. Cl.
  CPC ...... *H01L 29/1095* (2013.01); *H01L 29/1608* (2013.01); *H01L 29/4236* (2013.01); *H01L 29/66068* (2013.01)

(56) References Cited

U.S. PATENT DOCUMENTS

| | | | |
|---|---|---|---|
| 9,318,558 B2* | 4/2016 | Mine | H01L 29/1608 |
| 2003/0122188 A1* | 7/2003 | Blanchard | H01L 29/0634 257/341 |
| 2003/0181010 A1* | 9/2003 | Blanchard | H01L 29/0634 438/268 |
| 2009/0272982 A1 | 11/2009 | Nakamura et al. | |

FOREIGN PATENT DOCUMENTS

| | | |
|---|---|---|
| JP | 2006-32655 A | 2/2006 |
| JP | 2006-93193 A | 4/2006 |
| JP | 2009-206221 A | 9/2009 |
| JP | 2009-302510 A | 12/2009 |
| WO | 03/081642 A2 | 10/2003 |
| WO | 2010/090024 A1 | 8/2010 |
| WO | 2014/010006 A1 | 1/2014 |

OTHER PUBLICATIONS

Evans et al.; Deep Reactive Ion Etching (DRIE) of High Aspect Ratio SiC Microstructures using a Time-Multiplexed Etch-Passivate Process; Materials Science Forum; Oct. 2006; pp. 1115-1118; vols. 527-529; Trans Tech Publications, Zurich, Switzerland.

* cited by examiner

METHOD FOR PRODUCING A SUBSTRATE, SUBSTRATE, METAL-OXIDE-SEMICONDUCTOR FIELD-EFFECT TRANSISTOR WITH A SUBSTRATE, MICRO-ELECTROMECHANICAL SYSTEM WITH A SUBSTRATE, AND MOTOR VEHICLE

This application is a 35 U.S.C. § 371 National Stage Application of PCT/EP2014/066951, filed on Aug. 7, 2014, which claims the benefit of priority to Ser. No. DE 10 2013 217 768.2, filed on Sep. 5, 2013 in Germany, the disclosures of which are incorporated herein by reference in their entirety.

The present disclosure relates to a method for producing a substrate, to a substrate, to a metal oxide semiconductor field-effect transistor with a substrate, to a microelectromechanical system with a substrate, and to a motor vehicle.

BACKGROUND

Substrates which comprise a silicon carbide layer are being used increasingly in standard components. For example, power semiconductors which block up to voltages of more than 1.2 kV are produced as trench metal oxide semiconductor field-effect transistors (trench MOSFETs) by using such substrates. Such power semiconductors are used, for example, in electro-mobile applications, i.e. motor vehicles with batteries, for example batteries based on lithium ion cells, or in photovoltaic systems. Microelectromechanical systems may also be produced with such substrates. For microelectromechanical systems, the substrate may furthermore comprise a silicon dioxide layer, a silicon nitride layer or a silicon layer, on which the silicon carbide layer is deposited.

In order to produce a trench MOSFET, for example, a substrate (monocrystalline n-doped 4H-SiC substrate) is used, the silicon carbide layer of which has a hexagonal crystal structure and is n-doped. An n-doped silicon carbide buffer layer is arranged between the silicon carbide layer and a weakly n-doped silicon carbide drift zone (n-drift zone).

Such production of a trench MOSFET 100 according to the prior art is shown in FIG. 1. Arranged on then-doped 4H-SiC substrate 10, there is a moderately p-doped silicon carbide layer (p$^-$-layer) 20, which may be epitaxially grown or implanted. Arranged on a part of the p$^-$-layer 20, there is a heavily n-doped silicon carbide layer (n$^+$-source) 30 which may be epitaxially grown or implanted and is used as a source terminal. In this case, a rear side of the 4H-SiC substrate 10 is used as a drain terminal. Next to the n$^+$-source 30, a p$^+$-terminal (p$^+$-plug) 40 is implanted as far as into the p$^-$-layer 20, so that an upper side of the p$^+$-plug 40 follows on from the upper side of the n$^+$-source 30 and the p$^+$-plug 40 can be used for defining a channel potential. The p$^-$-layer 20 and the n$^+$-source 30 are respectively structured by a recess, which is arranged over a trench with which the n-drift zone 10 is structured. The recesses have an equal constant width in cross section. Apart from a bottom region, the trench also has the same width. Only in the bottom region does the width of the trench taper because of the structuring, so that the trench has a cup-shaped profile in cross section. The trench is also concave in cross section.

After the structuring, the trench may be coated with a gate oxide. As an alternative or in addition, a heavily doped implantation may be carried out in the bottom of the trench. A polysilicon gate 50 is then deposited into the trench. A vertical channel region 25 is thus formed in the p$^-$-layer 20. This allows a higher packing density of parallel-connected transistors than in the case of transistors with a lateral channel region.

The transition, due to the structuring, from the side wall of the trench to the bottom of the trench may lead in the application to very high field strengths in this region, which are greater than the breakdown threshold at which the oxide layer is electrically broken through in the off state and the component is damaged.

SUMMARY

According to the disclosure, a method for producing a substrate for a metal oxide semiconductor field-effect transistor or a microelectromechanical system is provided. In this case, the substrate comprises a silicon carbide layer. The method is characterized in that the method comprises the following steps: (a) dry etching of a temporary trench into the substrate by using a structured first masking layer, the dry etching being carried out in such a way that a residue of the first structured masking layer remains, (b) application of a second masking layer at least on walls of the temporary trench, and (c) dry etching by using the residue of the first masking layer and the second masking layer so that a trench with a step is formed in the trench.

A trench with a step can thus be produced easily in a self-aligning way.

In one embodiment, step (b) may comprise the following: conformal application of the second masking layer, one part of the second masking layer being applied on walls of the temporary trench, a further part being applied on a bottom of the temporary trench, and yet another part being applied on the residue of the structured first masking layer, and removal of the further part and of the yet another part by dry etching.

The part of the masking layer on walls of the temporary trench then protects the step of the trench during the further etching.

The method may furthermore comprise implantation of ions in the bottom of the temporary trench after step (a) and before step (b).

Thus, a doped zone can be produced easily below the step. This improves the breakdown protection even more.

Step (a) may comprise the following: conformal application of the first masking layer, application of a structured photoresist onto the first masking layer; and structuring of the first masking layer by plasma etching by using the photoresist.

The structured first masking layer can thus be produced easily.

The silicon carbide layer may have a hexagonal crystal structure, on which a moderately p-doped silicon carbide layer is arranged, wherein a heavily n-doped silicon carbide layer is arranged on at least a part of the moderately p-doped silicon carbide layer. Then, in step (a), the first masking layer may be applied conformally onto the heavily n-doped silicon carbide layer and recesses may also be formed in the moderately p-doped silicon carbide layer and in the heavily n-doped silicon carbide layer by etching in step (a), wherein the recesses are arranged over the temporary trench and have an equal width in cross section, which corresponds to a width of the temporary trench.

Such a substrate is then suitable for a metal oxide semiconductor field-effect transistor with particular security against breakdown. In the case of such a metal oxide semiconductor field-effect transistor, the trench is then filled as far as the step with a dielectric.

Furthermore, a gate electrode which comprises polycrystalline silicon is arranged at least partially over the dielectric in the trench, as well as partially in the recesses, a vertical channel region being formed in the moderately p-doped silicon carbide layer by the arrangement.

A sufficiently thick dielectric can thus be produced, the effect of which is that the field strengths occurring in the metal oxide semiconductor field-effect transistor remain below the breakdown threshold.

In one embodiment of the metal oxide semiconductor field-effect transistor, the dielectric may also cover the trench walls above the step.

The resulting metal oxide semiconductor field-effect transistor is then protected even more effectively against breakdown.

According to the disclosure, a microelectromechanical system is furthermore provided. In this case, the microelectromechanical system comprises a substrate which is produced by the method provided according to the disclosure. The substrate furthermore comprises a silicon dioxide layer, a silicon nitride layer or a silicon layer, on which the silicon carbide layer is deposited. A part of the trench above the step is formed entirely in the silicon carbide layer.

According to the disclosure, a motor vehicle is furthermore provided. The motor vehicle is provided with a power switch which comprises a metal oxide semiconductor field-effect transistor provided according to the disclosure.

Lastly, a substrate produced by the method provided according to the disclosure is provided.

Advantageous refinements of the disclosure are specified in the dependent claims and described in the description.

BRIEF DESCRIPTION OF THE DRAWINGS

Exemplary embodiments of the disclosure will be explained in more detail with the aid of the drawings and the description below, in which.

DETAILED DESCRIPTION

A trench having a step, as used in the various aspects of the disclosure, may be produced in different ways.

Figure 1:
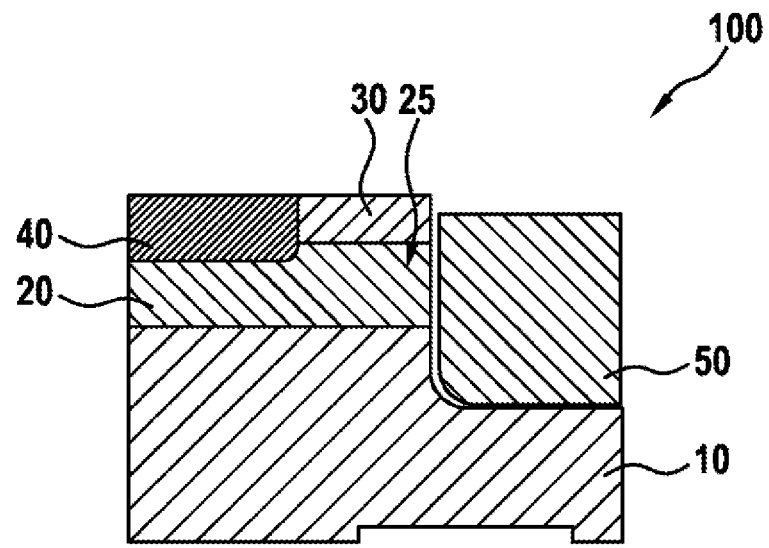
FIG. 1 shows a trench MOSFET according to the prior art.
Figure 2:
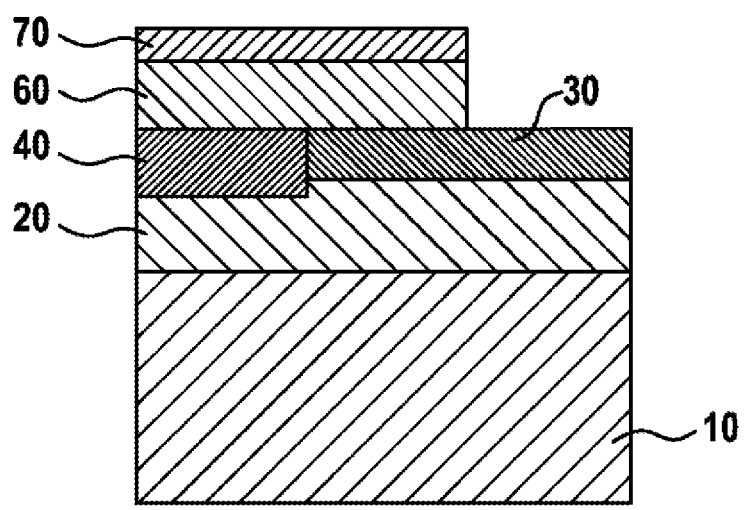
FIG. 2 shows an exemplary initial structure of a substrate for the production of a trench tapering in a stepped way in the substrate.
Figure 3:
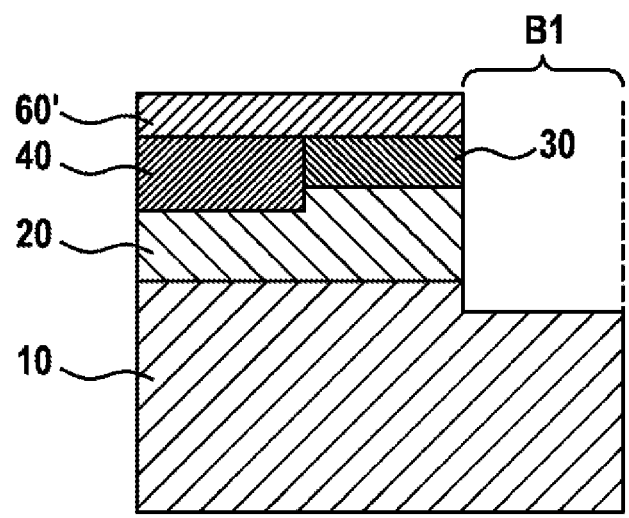
FIG. 3 shows an exemplary intermediate structure of the substrate.
Figure 4:
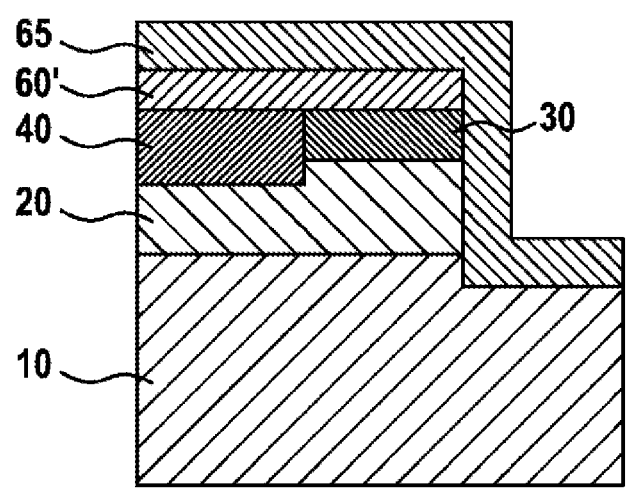
FIG. 4 shows a further exemplary intermediate structure of the substrate.
Figure 5:
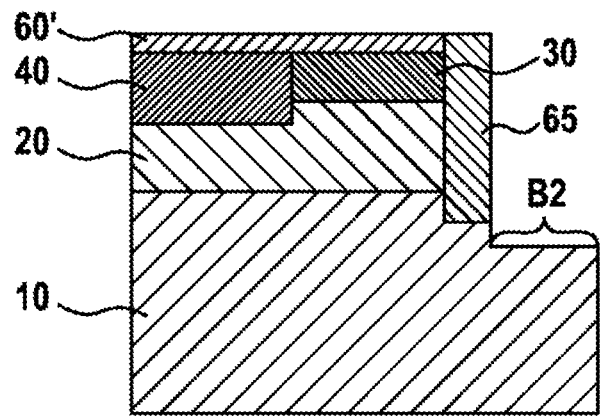
FIG. 5 shows yet another exemplary intermediate structure of the substrate.

FIGS. 2, 3 and 4 show exemplary structures of a substrate before and during the production of a trench tapering in a stepped way in the substrate.

An exemplary starting material for the exemplary production method of the trench is an n-doped silicon carbide layer with a hexagonal crystal structure (4H-SiC substrate) and a weakly n-doped epitaxial silicon carbide drift zone (n-drift zone) 10, between which an n-doped silicon carbide buffer layer is arranged. Formed thereon, a moderately p-doped silicon carbide layer (p$^-$-layer) 20 is epitaxially grown or implanted. A heavily n-doped silicon carbide layer (n$^+$-source) 30 is epitaxially grown or implanted thereon.

This n-doped silicon carbide layer 30 is used as a source terminal. A rear side of the 4H-SiC substrate 10 is used as a drain terminal.

The trench 90, which is depicted in FIGS. 2, 3, 4 and 5, has a stepped cross section with a step. The width of the trench 90 thus tapers downward once so that an upper region of the trench, above the step, has the untapered width B1 and a lower region of the trench, below the step, has the tapered width B2.

In order to achieve this, for example, a first masking layer 60, for example silicon dioxide, is applied in a first step. Then, for example, in a second step, a photoresist 70 is deposited over the first masking layer 60 and structuring of the photoresist 70 corresponding to the untapered width B1 is produced by means of photolithography. The first masking layer 60 is then structured with the aid of the structured photoresist corresponding to the untapered width B1. The resulting structure is represented in FIG. 2.

The structure is then etched by using the structured photoresist and the structured first masking layer 60 as a mask. A temporary trench with an untapered width B1 is formed. In this case, the structured photoresist 70 is fully removed, but the structured first masking layer 60 is only partially removed so that a residue 60' of the structured first masking layer remains. As an alternative thereto, the substrate etching may be preceded by dry or wet chemical removal of the photoresist. The substrate etching is then carried out exclusively by using the structured first masking layer 60 as a mask, a residue 60' of the structured first masking layer likewise remaining. The resulting structure is represented by way of example in FIG. 3.

A second masking layer 65 is then applied conformally onto a surface of the residue 60' of the first masking layer as well as the bottom and walls of the temporary trench. The resulting structure is represented by way of example in FIG. 4.

Further etching is carried out. First, the second masking layer 65 on the surface of the residue 60' of the first masking layer and on the bottom of the temporary trench is removed. The part 65' of the second masking layer remains arranged on the walls of the trench. The resulting structure is represented by way of example in FIG. 5.

Figure 6:
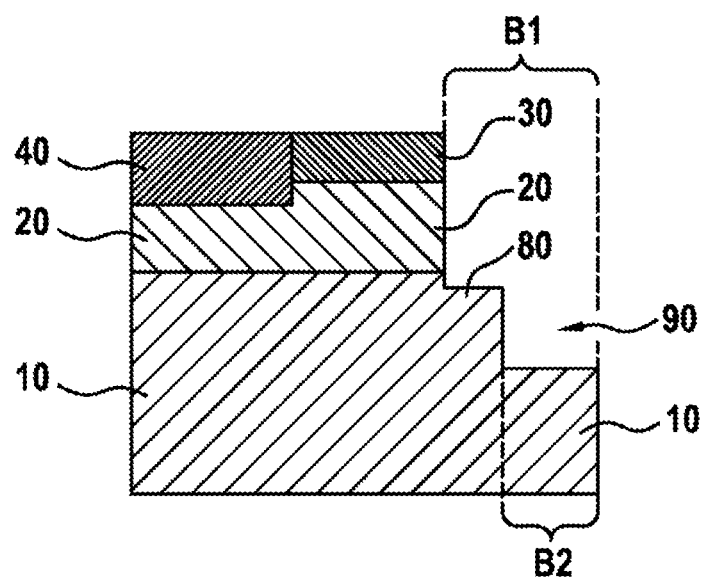
FIG. 6 shows an exemplary final structure of the substrate.

After the second masking layer 65 on the surface of the residue 60' of the first masking layer and on the bottom of the temporary trench has been removed, the further etching leads to the temporary trench being deepened further at the bottom in a tapered width B2, B2 being less than B1. The part 65' of the second masking layer is gradually eroded from above. Likewise, the residue 60' of the first masking layer is gradually eroded. As soon as the trench has reached the desired overall depth, the etching is ended. Possibly still existing material of the residue 60' and/or of the part 65' may then also be removed wet-chemically or dry-chemically. The resulting structure is represented by way of example in FIG. 6.

The untapered width B1 and the tapered width B2 are dependent on the lithography used. By means of stepper lithography, for example, minimum trench widths of 500 nanometers can be achieved for the tapered part of the trench, and the untapered part may then for example have a width of 800 nanometers. The distance of the step 80 from the upper side of the n$^+$-source 30 may, for example, be from 0.5 to 3 micrometers, and the distance of the step 80 from the bottom of the tapered part of the trench 90 may be about 0.2 to 2 micrometers.

In the trench, a dielectric may then first be deposited, which could for example fill the tapered part of the trench 90 as far as the step 80. In addition, the dielectric may cover walls of the trench above the step 80 with a thin layer. It is also possible, after the first etching and before removal of the photoresist, to carry out ion implantation which can thus be arranged more deeply in the substrate.

Lastly, a gate electrode 50 of polycrystalline silicon may be arranged above the step in the trench, so that a vertical channel region 25 is formed in the p⁻-layer 20.

The method explained with the aid of FIGS. 2, 3, 4, 5 and 6 for producing a stepped trench cross section in a silicon carbide layer may also be used for the production of microelectromechanical systems in which deposited silicon carbide layers, within which the trench with at least one stepped section in cross section is formed, are deposited. It is also possible for the silicon carbide layer to be deposited on a silicon dioxide layer, a silicon nitride layer or a silicon layer. Then, the part of the trench with an untapered width may be formed entirely in the silicon carbide layer, and the part of the trench with a tapered width may be formed entirely in the layer onto which the silicon carbide layer is deposited. In particular, the step may coincide with the transition from the layer onto which the silicon carbide layer is deposited to the silicon carbide layer. The part of the trench with a tapered width may also pass fully through the layer onto which the silicon carbide layer is deposited. For microelectromechanical systems, ratios of untapered width to tapered width of 100:1 may be envisioned, with tapered widths of from 1 to 10 micrometers. The distance from the step to the upper side of the silicon carbide layer may for example be from 1 to 10 micrometers, and the distance from the step to the bottom of the tapered part of the trench, or the lower side of the layer onto which the silicon carbide layer is deposited, may likewise be from 1 to 10 micrometers.

For example, silicon dioxide, silicon nitride, polysilicon or silicon carbide may be envisioned as materials for the first and second masking layers, in which case the first and second masking layers may comprise identical and different materials, and metal may also be envisioned as a material for one or both masking layers.

The invention claimed is:

1. A method for producing a substrate for a metal oxide semiconductor field-effect transistor or a microelectromechanical system, the substrate including a first silicon carbide layer having a hexagonal crystal structure, a moderately p-doped silicon carbide layer arranged on the first silicon carbide layer, and a heavily n-doped silicon carbide layer arranged on at least a part of the moderately p-doped silicon carbide layer, the method comprising:
    dry etching a temporary trench into the first silicon carbide layer by using a structured first masking layer, the dry etching being carried out in such a way that a residue of the first structured masking layer remains;
    applying a second masking layer at least on walls of the temporary trench; and
    dry etching by using the residue of the first masking layer and the second masking layer as masks so as to form a trench having a step located in the first silicon carbide layer.

2. The method as claimed in claim 1, wherein:
    applying the second masking layer comprises conformally applying the second masking layer, such that a first part of the second masking layer is applied on walls of the temporary trench, a second part is applied on a bottom of the temporary trench, and a third part is applied on a top surface of the residue of the structured first masking layer; and
    the dry etching by using the residue of the first masking layer and the second masking layer as masks comprises removing the second part and the third part by the dry etching.

3. The method as claimed in claim 1, further comprising:
    implanting ions in a bottom of the temporary trench after dry etching the temporary trench and before applying the second masking layer.

4. The method as claimed in claim 1, wherein the dry etching of the temporary trench comprises:
    conformally applying the first masking layer;
    applying a structured photoresist onto the first masking layer; and
    structuring the first masking layer by plasma etching by using the structured photoresist.

5. The method as claimed in claim 4, wherein: the dry etching of the temporary trench comprises:
    conformally applying the first masking layer onto the heavily n-doped silicon carbide layer; and
    forming recesses in the moderately p-doped silicon carbide layer and in the heavily n-doped silicon carbide layer during the dry etching of the temporary trench, the recesses being arranged over the temporary trench and having an equal width in cross section that corresponds to a width of the temporary trench.

* * * * *